United States Patent
Ernst et al.

(10) Patent No.: US 6,721,904 B2
(45) Date of Patent: Apr. 13, 2004

(54) SYSTEM FOR TESTING FAST INTEGRATED DIGITAL CIRCUITS, IN PARTICULAR SEMICONDUCTOR MEMORY MODULES

(75) Inventors: Wolfgang Ernst, München (DE); Gunnar Krause, München (DE); Justus Kuhn, München (DE); Jens Lüpke, München (DE); Jochen Müller, München (DE); Peter Pöchmüller, München (DE); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 422 days.

(21) Appl. No.: 09/907,693

(22) Filed: Jul. 18, 2001

(65) Prior Publication Data

US 2002/0010877 A1 Jan. 24, 2002

(30) Foreign Application Priority Data

Jul. 18, 2000 (DE) .......................... 100 34 855

(51) Int. Cl.[7] .................................. H02H 3/05
(52) U.S. Cl. ........................ 714/25; 714/724
(58) Field of Search ...................... 714/25, 29, 30, 714/31, 724, 733, 734, 738; 365/201, 212, 233; 711/103, 104, 112

(56) References Cited

U.S. PATENT DOCUMENTS

| | | | |
|---|---|---|---|
| 5,157,781 A | * 10/1992 | Harwood et al. | ............. 714/30 |
| 5,640,509 A | 6/1997 | Balmer et al. | |
| 5,889,936 A | * 3/1999 | Chan | ............................ 714/39 |
| 6,101,584 A | * 8/2000 | Satou et al. | ................. 711/152 |
| 6,556,492 B2 | * 4/2003 | Ernst et al. | ................... 365/201 |

FOREIGN PATENT DOCUMENTS

| | | | | |
|---|---|---|---|---|
| DE | 19928981 A1 | | 1/2000 | |
| JP | 02157675 A | * | 6/1990 | ........... G01R/31/28 |
| JP | 05264667 A | | 10/1993 | |

* cited by examiner

*Primary Examiner*—Dieu-Minh Le
(74) *Attorney, Agent, or Firm*—Laurence A. Greenberg; Werner H. Stemer; Ralph E. Locher

(57) ABSTRACT

The invention relates to a system for testing fast integrated digital circuits, in particular semiconductor modules, such as for example SDRAMs. In order to achieve the necessary chronological precision in the testing even of DDR-SDRAMs, with at the same time the high degree of parallelism of the test system required for mass production, an additional semiconductor circuit module (BOST module) is inserted into the signal path between a standard testing device and the SDRAM to be tested. This additional module is set up so as to multiply the relatively slow clock frequency of the conventional testing device, and to determine the signal sequence for control signals, addresses, and data background with which the SDRAM module is tested, dependent on signals of the testing device and also on register contents, programmed before the test, in the BOST module.

29 Claims, 1 Drawing Sheet

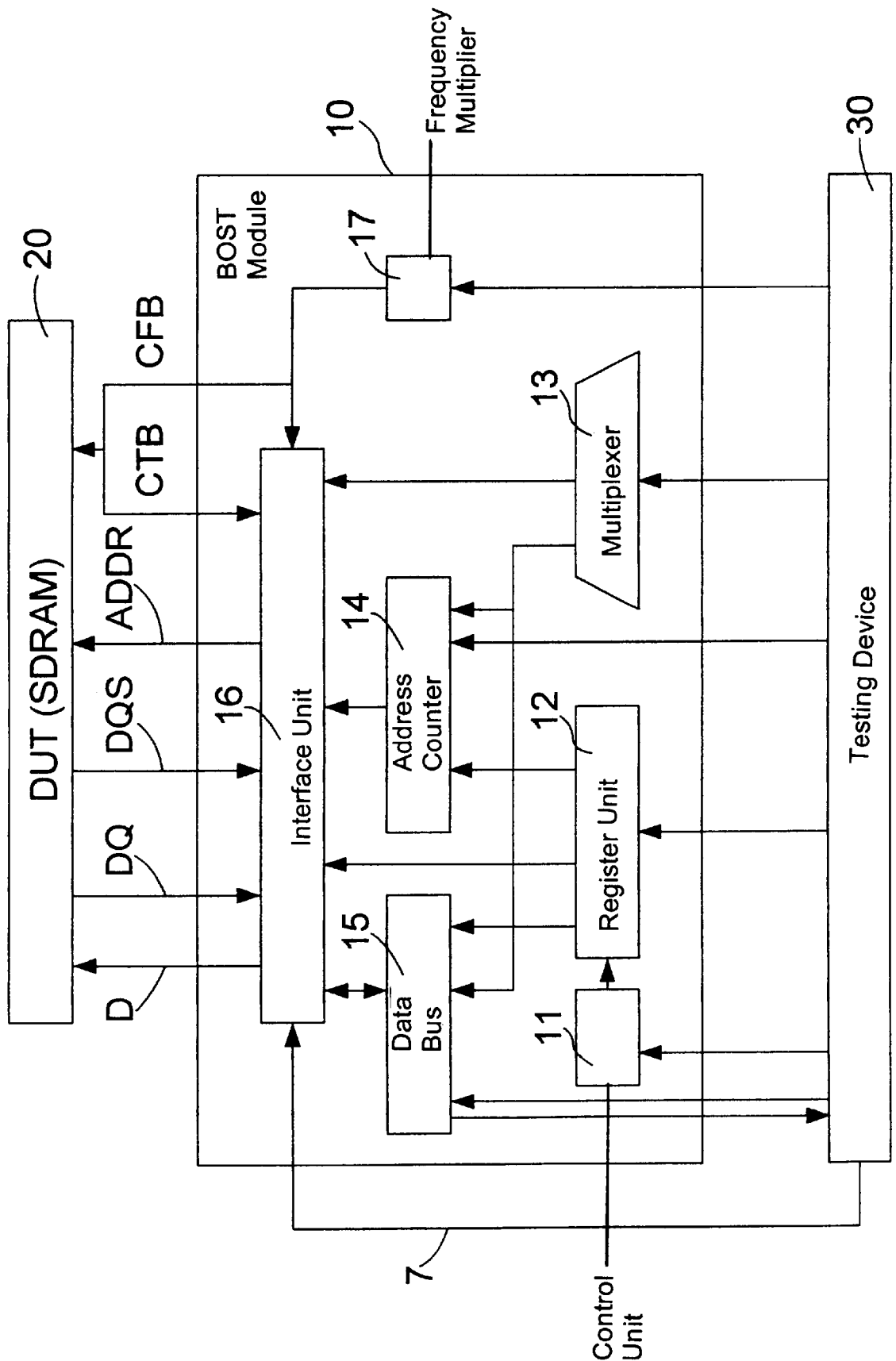

SYSTEM FOR TESTING FAST INTEGRATED DIGITAL CIRCUITS, IN PARTICULAR SEMICONDUCTOR MEMORY MODULES

BACKGROUND OF THE INVENTION

Field of the Invention

The invention relates to a system for testing fast integrated digital circuits, in particular semiconductor modules, e.g. SDRAMs (Synchronous Dynamic Access Memories), in which test signals, such as test data, test control signals, test address signals, and test clock signals are predetermined by a testing device and are supplied to the module to be tested, and the resulting signals that are produced the module undergoing testing and that are dependent upon the test signals are evaluated.

Using existing test systems alone, highly integrated fast digital circuits, such as semiconductor memory modules, that are distinguished by high data rates and clock frequencies cannot be tested economically with the necessary chronological precision and the parallelism required for high-volume production.

In particular, for SDRAMs of generations 64 M to 1 G, having clock frequencies >150 MHz, there are currently no test systems having sufficient test precision that include the parallelism necessary for an economical testing, i.e., with which a plurality of memory modules can be tested in parallel. The current testing of SDRAMs having double data rate (DDR) involves a reduction of parallelism that is unacceptable for production conditions.

Thus, for the testing of DDR-SDRAMs there currently exists no effective test system that enables the required chronological precision and that has sufficient parallelism for mass production.

Published German Patent application DE 199 28 981 A1 teaches a testing system for testing semiconductor memory units that produces test signals, supplies them to semiconductor memory units that are to be tested, and evaluates result signals produced by these. The known test system can test a plurality of semiconductor memory units simultaneously and can execute a logical comparison process with a correct time controlling, even if the phases of internal clock pulses emitted by a multiplicity of semiconductor memory units to be tested simultaneously are irregular.

Published Japanese Patent application JP 05-264,667 A specifies a testing circuit integrated in an LSI (Large-Scale Integration) semiconductor circuit that obtains a slow clock signal and produces from it a high-speed clock signal, using a frequency multiplier. In addition, test data supplied slowly through the testing circuit are converted into rapid test data by means of parallel-serial converters and multiplexers, which data are supplied, as rapid test data, to a circuit part of the LSI circuit that operates with a high-frequency clock signal.

SUMMARY OF THE INVENTION

It is accordingly an object of the invention to provide a testing system that is suitable for testing fast integrated digital circuits, in particular semiconductor memory modules with high data throughput, such as for example SDRAMs, that includes the required chronological precision and at the same time offers the possibility of testing a larger number of digital circuit modules simultaneously, i.e. in parallel. Moreover, it is an object of the invention to provide a semiconductor circuit module (BOST module) that can be used for such a test system.

With the foregoing and other objects in view there is provided, in accordance with the invention a system for testing a semiconductor module, that includes a semiconductor module to be tested that produces signals and that receives a clock signal having a clock frequency; and a testing device for producing relatively slower test signals including background data signals, control signals, address signals, and a clock signal having a frequency. The testing device is also for evaluating the signals produced by the module to be tested. The module to be tested and the testing device define a signal path therebetween. The system also includes an additional semiconductor circuit module inserted into the signal path between the testing device and the module to be tested.

The additional semiconductor circuit module includes: a control unit that is connected to and controlled by the testing device; and an n:1 multiplexer connected to the testing device. The multiplexer is for, during test operation, converting the relatively slower background data signals, control signals, and address signals from the testing device into relatively faster internal signals for controlling background data signals, control signals including write/read signals, and a sequence of address signals that are supplied to the module to be tested. The additional semiconductor circuit module includes a register unit that is connected to the control unit and to the testing device. The register unit is programmable by the testing device. The register unit is configured for controlling the background data signals, the control signals including the write/read signals, and the sequence of the address signals that are supplied to the module to be tested. The additional semiconductor circuit module includes an address counter for producing the sequence of the address signals that are supplied to the module to be tested. The address counter is connected to the testing device, to the programmable register unit, and to the multiplexer. The additional semiconductor circuit module includes a data path connected to the testing device and to the multiplexer for supplying the background data to the module to be tested. The additional semiconductor circuit module includes an internal clock system including a frequency multiplier for multiplying the frequency of the clock signal from the testing device to obtain the clock frequency of the clock signal for the module to be tested. The additional semiconductor circuit module includes an interface unit connected to the module to be tested, to the address counter, to the programmable register unit, to the multiplexer, to the data path, and to the testing device in order to produce high precision output signals that are synchronized by the internal clock system and to achieve precise evaluation times of the signals produced by the module to be tested.

In accordance with an added feature of the invention, the module to be tested is a SDRAM module, and the additional semiconductor module is switchable between a single data rate and a double data rate in dependence upon contents of the register unit.

In other words, the inventive test system is defined by the following measures: An additional semiconductor circuit module (BOST module) is inserted into the signal path between the conventional, relatively slow testing device and the module (Device Under Test DUT) that is to be tested. BOST is an abbreviation that stands for "Build Outside Self Test." The BOST module has the following functions:

A previously standard, economical testing device controls one or more BOST modules with the relatively slow clock frequencies associated with the testing device.

The BOST module operates the module DUT to be tested with a multiple of the clock frequency of the testing device.

The signal sequence, in particular commands, addresses, and data background with which the digital circuit module is tested, is determined both by signals of the testing device and also by contents, programmed before the test, of a register in the BOST module.

With the contents stored in this register, the BOST module can be switched between single-data-rate mode (SDR) and double-data-rate mode (DDR) during the test of an SDRAM.

The BOST module supplies, even at the maximum output frequency, output signals whose edges have a very high degree of chronological precision.

Through variation of the phase position of the output signals, testing of critical setup/hold times is enabled in a manner that is separate for different pin groups (clock, data, addresses). The same holds for the input signals of the BOST module for testing of the access times. The adjustable chronological resolution is a fraction of the clock frequency of the module that is to be tested.

The voltage level of the signals output by the BOST module to the module to be tested or DUT are predetermined by an external voltage level, in particular by the testing device. The same holds for the input signals for testing the signal level of the signals driven by the module to be tested.

The signal runtime between the BOST module and the digital circuit module DUT to be tested is taken into account through feeding the clock signal emitted by the BOST module to the digital circuit module back to the BOST module. In this way, the exact time of evaluation of the data driven by the digital circuit module DUT can be defined.

The BOST module has two operating states:
(a) Before each test of the digital circuit module, the registers of the BOST module for the sequence controlling of the subsequent test are loaded by the testing device;
(b) During the test, the sequence of the output signals to the tested digital circuit module DUT is controlled both via the contents loaded into the register unit and also via the signal values supplied by the testing device.

When, given a parallel test, as is preferred, a BOST module is spatially allocated to each digital circuit module of the same type, a parallel test of, for example, 16 digital circuit modules can be carried out with 16 BOST modules connected between a standard testing device and these digital circuit modules. The BOST modules for a module to be tested at the wafer level are thereby integrated into the probe card. If digital circuit modules are to be tested at the component level, a BOST module is arranged directly underneath the base of the module to be tested.

Using the inventive test system, through the use of the BOST modules, the previously standard, relatively slow testing devices can be further used for testing memory modules, for example SDRAMs, that have high clock frequencies and that also operate in double data rate mode. It is thereby decisive that the high degree of flexibility that standard testing devices offer with regard to programming and the selection of test conditions can be further used, thus ensuring the required test level for the testing of the newest SDRAMs.

Other features which are considered as characteristic for the invention are set forth in the appended claims.

Although the invention is illustrated and described herein as embodied in a system for testing fast integrated digital circuits, in particular semiconductor memory modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a block diagram of an inventive test system in which a BOST module is connected between a standard testing device and a SDRAM module that is to be tested.

DESCRIPTION OF THE PREFERRED EMBODIMENTS

Referring now to the sole drawing FIGURE, there is shown a block diagram of a preferred exemplary embodiment of an inventive test system in which a BOST (Build Outside Self Test) module 10 is connected between a conventional standard testing device 30 and a SDRAM module (DUT) 20 that is to be tested. For testing the memory module 20 on the wafer level, the BOST module 10 (or BOST modules 10) is (are) integrated into a probe card in order to enable realization of very short signal runtimes via the contacting needles contacting the wafer. For the test of a memory module 20 on the component level, a respective BOST module 10 is arranged on a circuit board directly underneath the base of the memory module to be tested, e.g. an SDRAM.

In order to optimize the overall test sequence from the testing device 30 through the BOST module 10 and to the memory module 20, in which contacting needles or bases have been provided for the memory module (DUT) 20 to be tested, the BOST module 10 has the following properties:

Due to the low input clock frequency of the testing device 30, the inputs of BOST module 10 make low demands on the signal quality, so that, as mentioned, a plurality of BOST modules can be operated by the testing device 30 through one and the same channel (shared driver concept). In this way, the parallelism of standard testing device 30 can be increased beyond the parallelism that can be realized today, while maintaining the necessary chronological precision at the memory module to be tested.

The short signal path between the BOST module 10 and the memory module 20 enables a high degree of chronological precision immediately at memory module 20, without the high calibration expense of standard testing devices that is necessary in order to maintain the time conditions during production. This provides an asset, in terms of circuitry, in the realization of the testing device.

In order to minimize the size of the BOST module 10, the necessary logic on the BOST modules 10 is kept simple through the use of highly flexible standard testing devices 30 for controlling the BOST modules 10, and the overall testing system, consisting of the standard testing device plus the BOST module, nonetheless retains the maximal flexibility in pattern realization that is necessary in order to ensure the test level.

According to the block switching diagram shown in the FIGURE, the exemplary embodiment of the BOST module 10 includes the following functional units. A BOST control unit 11 that is connected with testing device 30 in BOST module 10 is in turn connected with a BOST register unit 12, and controls this unit. Control unit 11 is controlled by the testing device 30, and the register unit 12 is programmed by the latter. The register contents of register unit 12 influence, among others, the address sequence, the data background, and the read/write signals with which the memory module (DUT) 20 is tested. The phase position of the output pin groups, and further settings relating to the test conditions, are likewise previously stored as register contents. The choice of which register contents are used is influenced during the test by control signals from testing device 30. An n:1 multiplexer 13 is connected with the testing device 30, and during test operation converts the slow data from the testing device 30 into internal rapid signals in order to control the address sequence, the data background, and the read/write signals with which DUT 20 is tested. The n:1 multiplexer 13 is connected on the one hand with an address counter 14 that produces the address sequence with which DUT 20 is tested. In addition, address counter 14 is connected with the register unit 12 and with the testing device 30. A data path or data bus 15 is connected with the n:1 multiplexer 13, the register unit 12, and the testing device 13 and produces the data background with which the DUT 20 is described, or the data background with which the data read by the DUT are compared. Finally, controlled by the BOST's separate clock system, an interface unit 16, which forms the interface to the memory module DUT to be tested, chronologically produces high-precision output signals and evaluation times for the data driven by DUT or SDRAM 20. The voltage level is immediately impressed into the interface unit 16 by the testing device 30 via a line 7. As can be seen, the interface unit 16 is connected with the register unit 12, the n:1 multiplexer 13, the data bus 15, and a clock system that is in BOST module 10. Moreover, the interface unit 16 is connected with the testing device 30, and forms the interface for the data address channel, the control signal channel, and the clock signal channel from the BOST module to the memory module 20 DUT to be tested, and vice versa. The BOST's own clock system has a frequency multiplier 17 for multiplying the frequency of a clock signal supplied by the testing device 30. The clock system also has a DLL (delay locked loop) for stabilizing and maintaining particular phase conditions of the clock pulse emitted via line CFB. Through sampling and feedback to the BOST module 10, via line CTB, of the clock signal emitted via line CFB, an adaptation to the signal runtime BOST-DUT-BOST is carried out in order to determine the evaluation time. In interface unit 16, various phase positions of the internal clock are provided for setting the time control parameters to be tested of the DUT or SDRAM 20. One of these phase positions generated from the clock signal CTB is fed back from the SDRAM 20 to the BOST module 10 in order to take into account the signal runtime between the BOST module 10 and the DUT (or SDRAM) 20 to be tested, or for the purpose of adapting to this signal runtime. In this way, the exact time of evaluation of the data driven by SDRAM 20 can be defined.

The signals that are to be guided from the BOST module 10 to the DUT 20 or SDRAM to be tested, and vice versa, are:

D: data to DUT 20,
DQ: data output from DUT 20 to the BOST module,
DQS: strobe signal for D and DQ (given D, the DUT 'strobes'),
ADDR: addresses,
CTB: fed back clock signal,
CFB: BOST-generated clock signal for the DUT, having one of a plurality of phase positions derived from a master clock frequency (stabilized by DLL).

Using the circuit arrangement shown in the FIGURE and specified above, and the associated functions of the BOST module 10 in combination with the properties of a conventional, highly flexible testing device 30, a testing system is enabled that can simultaneously test a larger number of memory modules, in particular SDRAMs having high clock frequencies and double data rate (DDR). It is thereby decisive that the high degree of flexibility offered by the standard testing device 30 with respect to the programming and the selection of test conditions can continue to be used, and can thus ensure the necessary test level for testing the newest SDRAMs. The above-defined BOST module has a design with still-practicable complexity, can be manufactured relatively economically as an ASIC module. The BOST module guarantees, in its protocol for the tester, a sufficient degree of flexibility to enable SDR and DDR-SDRAM modules to be tested, according to their specification, more precisely and more economically than was previously possible.

We claim:

1. A system for testing a semiconductor module, comprising:

a semiconductor module to be tested that produces signals and that receives a clock signal having a clock frequency;

a testing device for producing relatively slower test signals including background data signals, control signals, address signals, and a clock signal having a frequency, the testing device also for evaluating the signals produced by the module to be tested, the module to be tested and the testing device defining a signal path therebetween; and an additional semiconductor circuit module inserted into the signal path between the testing device and the module to be tested;

said additional semiconductor circuit module including:

a control unit connected to and controlled by the testing device;

an n:1 multiplexer connected to the testing device, said multiplexer for, during test operation, converting the relatively slower background data signals, control signals, and address signals from the testing device into relatively faster internal signals for controlling background data signals, control signals including write/read signals, and a sequence of address signals that are supplied to the module to be tested;

a register unit connected to said control unit and to the testing device, said register unit being programmable by the testing device, said register unit configured for controlling the background data signals, the control signals including the write/read signals, and the sequence of the address signals that are supplied to the module to be tested;

an address counter for producing the sequence of the address signals that are supplied to the module to be tested, said address counter connected to the testing device, to said programmable register unit, and to said multiplexer;

a data path connected to the testing device and to said multiplexer for supplying the background data to the module to be tested;

an internal clock system including a frequency multiplier for multiplying the frequency of the clock signal from the testing device to obtain the clock frequency of the clock signal for the module to be tested; and an interface unit connected to the module to be tested, to said address counter, to said programmable register unit, to said multiplexer, to said data path, and to said testing device in order to produce high precision output signals that are synchronized by said internal clock system and to achieve precise evaluation times of the signals produced by the module to be tested.

2. The test system according to claim 1, wherein the module to be tested is a SDRAM module, and said additional semiconductor module is switchable between a single data rate and a double data rate in dependence upon contents of said register unit.

3. The test system according to claim 2, wherein:

said register unit has registers;

said additional semiconductor module has a first operating state and a second operating state;

the first operating state is a load state, in which before each test of the module to be tested, said registers of said programmable register unit are loaded by said testing device for sequentially controlling a subsequently initiated test; and the second operating state is a test sequence state, during which a sequence of the output signals that are supplied to the module to be tested is controlled both with register values that are loaded into said registers of said register unit and also with output signals that are supplied by said testing device.

4. The test system according to claim 1, wherein:

said register unit has registers;

said additional semiconductor module has a first operating state and a second operating state;

the first operating state is a load state, in which before each test of the module to be tested, said registers of said programmable register unit are loaded by said testing device for sequentially controlling a subsequently initiated test; and the second operating state is a test sequence state, during which a sequence of the output signals that are supplied to the module to be tested is controlled both with register values that are loaded into said registers of said register unit and also with output signals that are supplied by said testing device.

5. The test system according to claim 4, wherein in the load state, said register unit stores register contents that are predetermined by said testing device, said register contents relating to a phase position of output pin groups.

6. The test system according to claim 5, wherein:

in the test sequence state, said testing device supplies control signals; and said register unit selects register values that are determined by the control signals.

7. The test system according to claim 4, wherein:

in the test sequence state, said testing device supplies control signals; and said register unit selects register values that are determined by the control signals.

8. The test system according to claim 1, wherein said interface unit is constructed to vary a phase position of the output signals separately for different pin groups, the output signals being output to the module to be tested.

9. The test system according to claim 1, wherein said interface unit is constructed to test, separately for different pin groups, a phase position of the signals produced by the module under test.

10. The test system according to claim 1, wherein voltage levels of the output signals are output by said interface unit to the module to be tested and comparison levels for the signals produced by the module to be tested are externally predetermined.

11. The test system according to claim 10, wherein the voltage levels of the output signals and the comparison levels are predetermined by the testing device.

12. The test system according to claim 1, wherein:

said module to be tested includes a clock system providing a clock signal defined as a test module clock signal;

said internal clock system includes a feedback of the test module clock signal to said additional semiconductor circuit module to determine a signal run-time between said additional semiconductor circuit module and the module to be tested and to define an exact evaluation time period for data operated on by the module to be tested.

13. The test system according to claim 1, wherein said additional semiconductor module is set up for a simple GO/NO GO test evaluation.

14. The test system according to claim 1, comprising:

a plurality of modules to be tested; and a plurality of additional semiconductor circuit modules;

each one of the plurality of the additional semiconductor circuit modules are allocated to a respective one of the plurality of the modules to be tested.

15. The test system according to claim 14, comprising a probe card into which the plurality of the additional semiconductor circuit modules are integrated, the plurality of the modules to be tested being tested at a wafer level.

16. The test system according to claim 14, comprising:

a circuit board;

the plurality of the modules to be tested being tested at a component level;

said circuit board located at a position selected from the group consisting of directly alongside the plurality of the modules to be tested and underneath the plurality of the modules to be tested;

said circuit board including the plurality of the additional semiconductor circuit modules.

17. The test system according to claim 1, wherein the module to be tested is a SDRAM.

18. A BOST module for connection to an external testing device and to a module to be tested in order to test the module to be tested, the BOST module comprising:

a control unit for connection to a testing device, said control unit configured to be controlled by the testing device;

an n:1 multiplexer for connection to the testing device, said multiplexer for, during test operation, converting relatively slower background data signals, control signals, and address signals received from the testing device into relatively faster internal signals for controlling background data signals, control signals including write/read signals, and a sequence of address signals that are supplied to the module to be tested;

a register unit connected to said control unit and for connection to the testing device, said register unit being programmable by the testing device, said register unit configured for controlling the background data signals, the control signals including the write/read signals, and the sequence of the address signals that are supplied to the module to be tested;

an address counter for producing the sequence of the address signals that are supplied to the module to be tested, said address counter configured for connection to the testing device, said address counter connected to said programmable register unit and to said multiplexer;

a data path configured for connection to the testing device and connected to said multiplexer for supplying the background data to the module to be tested;

an internal clock system including a frequency multiplier for multiplying the frequency of the clock signal of the testing device to obtain a clock frequency of a clock signal for the module to be tested; and an interface unit configured for connection to the module to be tested, said interface unit connected to said address counter, to said programmable register unit, to said multiplexer, and to said data path, said interface unit configured for connection to said testing device in order to produce high precision output signals that are synchronized by said internal clock system and to achieve precise evaluation times of the signals produced by the module to be tested.

19. The BOST module according to claim 18, wherein the module to be tested is a SDRAM module, and said additional semiconductor module is switchable between a single data rate and a double data rate in dependence upon contents of said register unit.

20. The test system according to claim 19, wherein:

said register unit has registers;

in a load state, before each test of the module to be tested, said registers of said programmable register unit are loaded by the testing device for sequentially controlling a subsequently initiated test; and in a test sequence state, a sequence of the output signals that are supplied to the module to be tested is controlled both with register values that are loaded into said registers of said register unit and also with output signals that are supplied by the testing device.

21. The BOST module according to claim 18, wherein:

said register unit has registers;

in a load state, before each test of the module to be tested, said registers of said programmable register unit are loaded by the testing device for sequentially controlling a subsequently initiated test; and in a test sequence state, a sequence of the output signals that are supplied to the module to be tested is controlled both with register values that are loaded into said registers of said register unit and also with output signals that are supplied by the testing device.

22. The test system according to claim 21, wherein in the load state, said register unit stores register contents that are predetermined by the testing device, said register contents relating to a phase position of output pin groups.

23. The test system according to claim 21, wherein in the test sequence state, said register unit selects register values that are determined by control signals received from the testing device.

24. The BOST module according to claim 18, wherein said interface unit is constructed to vary, separately for different pin groups, a phase position of the output signals.

25. The BOST module according to claim 18, wherein said interface unit is constructed to test, separately for different pin groups, a phase position of signals produced by the module under test.

26. The BOST module according to claim 18, wherein voltage levels of the output signals are output by said interface unit to the module to be tested and comparison levels for signals produced by the module to be tested are externally predetermined.

27. The BOST module according to claim 18, wherein said internal clock system feeds back a clock signal received from the module under test to determine a signal run-time and to define an exact evaluation time period for data operated on by the module to be tested.

28. The BOST module according to claim 18, wherein said module is set up for a simple GO/NO GO test evaluation.

29. The BOST module according to claim 18, comprising an ASIC semiconductor circuit having configured therein said control unit, said multiplexer, said register unit, said address counter, said data path, said internal clock system, and said interface unit.

* * * * *